(12) United States Patent
Ikegami

(10) Patent No.: US 6,674,178 B1
(45) Date of Patent: Jan. 6, 2004

(54) SEMICONDUCTOR DEVICE HAVING DISPERSED FILLER BETWEEN ELECTRODES

(75) Inventor: Gorou Ikegami, Shiga (JP)

(73) Assignee: NEC Electronics Corporation, Kanagawa (JP)

( * ) Notice: Subject to any disclaimer, the term of this patent is extended or adjusted under 35 U.S.C. 154(b) by 0 days.

(21) Appl. No.: 09/593,460

(22) Filed: Jun. 14, 2000

(30) Foreign Application Priority Data

Sep. 20, 1999 (JP) .......................................... 11/265632

(51) Int. Cl.⁷ .................. H01L 23/29; H01L 23/28; H01L 23/48; H01L 23/52
(52) U.S. Cl. ................. 257/789; 257/787; 257/788; 257/795; 257/778; 257/782; 257/737; 257/738; 257/780
(58) Field of Search ................. 257/737, 778, 257/787, 795, 780, 789

(56) References Cited

U.S. PATENT DOCUMENTS

| | | | |
|---|---|---|---|
| 5,641,996 A | * 6/1997 | Omoya et al. | 257/787 |
| 5,795,818 A | 8/1998 | Marrs | |
| 5,844,320 A | * 12/1998 | Ono et al. | 257/778 |
| 6,153,938 A | * 11/2000 | Kanda et al. | 257/778 |
| 6,184,577 B1 | * 2/2001 | Takemura et al. | 257/701 |
| 6,410,415 B1 | 6/2002 | Estes et al. | 438/612 |

FOREIGN PATENT DOCUMENTS

| | | |
|---|---|---|
| JP | 60-262430 | 12/1985 |
| JP | 63-241955 | 10/1988 |
| JP | 8-195414 | 7/1996 |
| JP | 9-97816 | 4/1997 |
| JP | 9-266229 | 10/1997 |
| JP | 10-107082 | 4/1998 |
| JP | 11-40606 | 2/1999 |
| JP | 11-87424 | 3/1999 |
| JP | 2914569 | 4/1999 |

* cited by examiner

Primary Examiner—Tom Thomas
Assistant Examiner—Nitin Parekh
(74) Attorney, Agent, or Firm—Sughrue Mion, PLLC

(57) ABSTRACT

In a semiconductor device, a semiconductor pellet having bump electrodes and a interconnection board having pad electrodes are brought into mutual opposition with a resin containing a filler therebetween, so that the bump electrode and the pad electrodes are superposed. With the filler remaining at the superposed parts between the electrodes, the electrode superposed parts are hot-pressed, and the semiconductor pellet and interconnection board are adhered by the resin.

13 Claims, 3 Drawing Sheets

SEMICONDUCTOR DEVICE HAVING DISPERSED FILLER BETWEEN ELECTRODES

BACKGROUND OF THE INVENTION

1. Field of the Invention

The present invention relates to a semiconductor device having a structure whereby a direct connection is made between an interconnection board and a semiconductor pellet.

2. Background of the Invention

To improve their portability, there is a desire to make compact electronic circuit devices for video cameras, notebook-size personal computers and the like smaller and lighter, and the achievement of smaller electronic components or electronic components of the same dimensions but a higher level of integration used therein contributes to the achievement of more compact and lightweight electronic circuit devices.

In semiconductor devices, while there has been reduction of the size of a semiconductor pellet and an increase in the level of integration, efforts are not limited to these improvements, and there have been direct connections made from a semiconductor pellet to an interconnection board, thereby improving the mounting density.

An example of this is illustrated in FIG. 9. In this drawing, the reference numeral 1 denotes a semiconductor pellet, which has a large number of bump electrodes 3 formed on a main surface of a semiconductor substrate 2 onto which are large number of electronic elements (not shown in the drawing) are formed. These bump electrodes 3 are generally formed by solder or gold.

The reference numeral 4 denotes an interconnection board, formed by a conductive pattern (not shown in the drawing) of copper formed on a surface of a insulating substrate 5, the conductive pattern being then covered by a photoresist film (not shown in the drawing). Windows are then formed in the photoresist film at positions opposite the bump electrodes 3, so as to expose part of the conductive pattern, thereby forming pad electrodes 6 at the windows. These pad electrodes 6 are generally made of a copper foil of thickness 12 to 18 $\mu$m, over which a nickel plating is covered to a thickness of 3 to 5 $\mu$m, and further over which gold is laminated to a thickness of 0.03 to 1 $\mu$m. In the drawing, however, this is shown as a single layer.

The reference numeral 7 denotes a resin that makes a mechanical connection between the semiconductor pellet 1 and the interconnection board 5, and which protects the interconnection pattern (not shown in the drawing) on the semiconductor pellet 1 from external corrosive gases.

The above-described structure is widely known, and is disclosed in Japanese Unexamined Patent Application publication S63-241955 (prior art 1), U.S. Pat. No. 5,795,818 (prior art 2), Japanese Unexamined Patent Application publication S60-262430 (prior art 3), and Japanese Unexamined Patent Application publication H9-97816 (prior art 4).

Of the above-noted prior art examples, in prior art 1 the bump electrode 3 is formed by solder, and the semiconductor pellet 1 is flip-chip connected to the interconnection board 4.

In the above-noted prior art 2, there is language describing the application of a load of approximately 20 g per bump electrode 3 to the pad electrodes 6, the semiconductor pellet 1 being heated to 240° C., and the interconnection board 4 being heated to 190° C., with ultrasonic vibration also being applied to the electrodes 3 and 6 so as to make a metal-to-metal joint, and another example noted is that in which a load of approximately 10 g per bump electrode 3 is applied, the semiconductor pellet 1 being heated to 180° C. and the interconnection board 4 being heated to 190° C., with ultrasonic vibration also being applied to the electrodes 3 and 6 so as to make a metal-to-metal joint.

In both prior art examples 1 and 2, after making a mechanical and electrical joint between the semiconductor pellet 1 and the interconnection board 4, a resin 7 is supplied between the semiconductor pellet 1 and the interconnection board 4 as an adhesive. Because there is a tiny spacing of approximately 100 $\mu$m between the semiconductor pellet 1 and the interconnection board 4, however, it is difficult for the resin 7 to enter therebetween, and even if it does enter therebetween, there is the problem of a tendency for air bubbles to remain.

Prior art 1 is such that air bubbles do not remain in the resin 7, but the work involved is troublesome.

In prior art 2, while it can be envisioned that there would be a tendency for air bubbles to remain in the resin 7, there is absolutely no language with regard to how these air bubbles are removed.

In contrast to the above, in prior art examples 3 and 4, a resin 7 is supplied to a region that includes the pad electrodes 6 on the interconnection board 4 beforehand, a semiconductor pellet 1 being supplied to the top of this resin 7 and pressure applied thereto, so that the pad electrodes 6 and the bump electrodes 3 are superposed, thereby forcing the resin 7 from between the bump electrodes 3 and the pad electrodes 6 and making an electrical connection between the electrodes 3 and 6. The applied pressure is maintained in this condition, and resin 7 is cured. After it hardens sufficiently, even if the applied pressure is released, the resin 7 between the semiconductor pellet 1 and the interconnection board 4 makes a mechanical connection, and the pressure between the electrodes maintains the electrical connections.

In the above-noted semiconductor device, because the resin 7 supplied to the top of the interconnection board 4 beforehand is pressed and spread out, it is difficult for air bubble to remain within the resin 7, thereby solving the problem that remained with the prior art examples 1 and 2.

In the prior art example 3, there is language to the effect that when a light-curable resin is used there is absolutely no heat applied to the semiconductor pellet 1 and the interconnection board 4, and even when using a thermally curable resin, the curing temperature is raised to no more than 150° C., the result being that it is possible to reduce the thermal distortion of constituent materials, and possible to achieve a connection having high reliability.

In the prior art example 4 as well, there is language to the effect that, although a thermally curable resin 7 is supplied as pressure is applied to join the bump electrodes 3 and the pad electrodes 6, by using a resin 7 that has a curing rate of contraction that is larger than the coefficient of thermal expansion, even in a high-temperature environment because the curing rate of contraction exceeds the coefficient of thermal expansion, force does not act to peel the bump electrodes from the pad electrodes, so that the connection does not become unstable, and language to the effect that, because the end of the bump electrode is in point contact with the pad electrode 6 with pressure applied therebetween, there is further broadening so as to achieve a surface contact, the result being that the resin 7 between the electrodes is driven out from the contacting parts, thereby enabling the achievement of a reliable contact, with no included impurities.

In this manner, in a semiconductor device according to the prior art examples 3 and 4, even after compression deformation is caused within the elastic limit of the bump electrodes 3 superposed with the pad electrodes 6 as the resin 7 is cured, the pressurized contact between the electrodes 3 and 6 is maintained.

The coefficients of thermal expansion of the semiconductor device elements such as semiconductor substrate 2, bump electrodes 3, insulating substrate 5, and pad electrodes 6, in a semiconductor pellet 1 which is based on silicon and an epoxy resin based interconnection board 4, are 2.4 PPM/° C., 15 PPM/° C., 16 PPM/° C., and 20 PPM/° C., respectively, and because the coefficients of thermal expansion of the insulating substrate 5, the pad electrodes 6 and the bump electrodes 3 are similar, differences in length caused by thermal expansion do not become a problem.

Although there is a large difference between the coefficients of thermal expansion of the semiconductor substrate 2 and the bump electrodes 3, because the diameters of each bump are small, there is substantially no problem.

However, between the semiconductor pellet 1 and the interconnection board 4 that are adhered by the resin 7, the ratio of coefficients of thermal expansion exceeds 6 and, because the arrangement length of the bump electrodes 3 is considerably long in comparison with the individual bump electrode 3 diameters, when the semiconductor device is operated, causing heating of the semiconductor pellet 1 to above room temperature, there is large difference in thermal expansion between the two adhesion surfaces of the resin 7.

For example, if a semiconductor pellet having an electrode arrangement length of 10 mm is heated to 80° C., the electrode arrangement length is lengthened by 1.9 $\mu$m, whereas the arrangement length of the pad electrodes 6 is lengthened by 12.8 $\mu$m. This length difference caused by thermal expansion is absorbed by the bimetal effect.

In the prior art examples 3 and 4, because the electrodes 3 and 6 are in pressurized contact, when stress caused by thermal expansion in the superposed surface direction is applied, there is position offset in the electrode contact surface, thereby relieving the stress on the electrode contact parts, enabling avoidance of the problem of electrode peeling.

Semiconductor devices in which a fine powder of alumina or silica is dispersed within the resin 7 for the purpose of achieving balance in the differences in thermal expansion are disclosed, for example, in the Japanese Unexamined Patent Application publications H8-195414 (prior art 5), H9-266229 (prior art 6), H10-107082 (prior art 7), and H11-87424 (prior art 8), and in Japanese Patent No. 2914569 (prior art 9) and Japanese Unexamined Patent Application publication H11-40606 (prior art 10).

Of the above, prior art examples, in prior art examples 5 to 9, after making an electrical connection between the semiconductor pellet 1 and the interconnection board 4, resin 7 is supplied to between the respective opposing surfaces. In prior art examples 5 to 8 in particular, there is disclosure of making the filler distribution within the resin 7 at the semiconductor pellet 1 side and interconnection board 4 side different, so as to adjust the thermal expansion coefficients.

In the prior art example 10, there is a disclosure of applying a resin 7 into which a filler is dispersed onto the interconnection board 4 and connecting a semiconductor pellet 1 to this interconnection board 4, the ends of the bump electrodes 3 being made sharp, so that they bite into the pad electrodes 6, thereby achieving a reliable electrical connection without the existence of a filler in the superposed parts of the electrodes 3 and 6.

In the case in which a high level of integration is to be achieved by increasing the number of bump electrodes without increasing the outer dimensions of the semiconductor pellet, the diameters of the bump electrodes 3 are reduced, the arrangement pitch therebetween is narrowed, and the bump electrodes are arranged in a staggered pattern.

If the diameters of the bump electrodes 3 are reduced, however, the variations in the height and shape of the bump electrodes before applying pressure become large.

In the semiconductor device disclosed in prior art examples 3 and 4, because a pressurized contact is achieved because of resilient deformation of the electrode metal, while it is possible to maintain the stable contact condition at high temperatures by virtue of the expansion of the electrodes themselves, at extremely low temperatures, because the boundary of superposition contracts in the peeling direction, the bump electrodes, which originally have a low profile, experience a reduction contact pressure, thereby causing an increase in the contact resistance.

If operation of a semiconductor device using a semiconductor pellet having this type of low bump electrode is started at an extremely low temperature, there is the problem of unstable operation occurring until the semiconductor pellet 1 reaches a sufficiently high temperature.

In particular, when the resin cures, the inorganic filler dispersed within the resin 7 acts as an insulating spacer disposed between the electrodes that have a low force acting between them, and if a tiny amount of resin remains in the space therebetween, this resin acts as a thin-film insulating spacer, thereby causing a faulty electric connection.

If the height of the bump electrodes 3 is reduced by a reduction in the diameter thereof, the limit of elastic deformation when pressure is applied to the superposed parts is lowered, so that if an excessive load is applied plastic deformation tends to occur, after which at extremely low temperatures there is the problem of a sudden increase in contact resistance between the electrodes.

The above-noted problems are particularly prominent when there is a large temperature difference between the time at which operation is started and the temperature after the start of operation, in which case there is a risk of noise being generated between electrodes, and of malfunctioning of the electronic circuit device.

Even with the technology disclosed in the prior art example 10, when the diameter of the bump electrodes 3 is made small in order to accommodate a large number of electrodes, it becomes difficult to make the ends thereof sharp and, because the pad electrode 6 must be covered with a soft metal to a sufficient thickness, immediate application of this technology was not possible from the standpoints of both technology and cost.

SUMMARY OF THE INVENTION

Accordingly, the present invention was devised to solve the above-described problems with the prior art, and has as an object to provide a semiconductor device wherein a semiconductor pellet having bump electrodes and an interconnection board having pad electrodes are positioned so as to be mutually opposing, with a resin into which a filler is dispersed and interposing therebetween, and with the bump electrodes and pad electrodes superposed, a hot-pressed connection being made at the superposed electrode parts with filler remaining therebetween, while adhering the semiconductor pellet and the interconnection board together using said resin.

It is another object of the present invention to provide a method for manufacturing a semiconductor device having a step of supplying a resin into which is dispersed a filler onto pad electrodes formed on an interconnection board having an insulating substrate on which a large number of pad electrodes are formed along at least one straight line or onto a region in the vicinity thereof; a step of bringing a semiconductor pellet formed with bump electrodes being capable of diameter thereof to be constricted toward the ends thereof and formed on a semiconductor substrate into opposition with and proximity to an interconnection board, so as to press the resin outward; a step of causing the ends of said bump electrodes to be inserted into the resin, and trapped part of the filler between said ends of said bump electrodes and said pad electrodes; a step of applying pressure so as to crush the end parts of said bump electrodes simultaneously with said resin being removed out of area formed between said superposed electrodes so as to superpose both electrodes; a step of maintaining the pressured condition in the superposed parts between said bump electrodes and said pad electrodes while heating at least said semiconductor pellet so as to thermally press said superposed parts of said each electrodes, and a step of curing said resin so as to adhere said semiconductor pellet and the interconnection board thereby.

In a semiconductor device according to the present invention, part of a filler that is dispersed in a resin that provides adhering between a semiconductor pellet and an interconnection board is caused to remain in the superposed boundary between the hot-pressed and connected bump electrodes and pad electrodes.

The structure of this semiconductor device is one in which part of the filler of a resin is caught between the end parts of bump electrodes formed with a constricted diameter at the end parts made of a soft conductive material and pad electrodes, the end parts of the pad electrodes being crushed so as to cause outward swelling of the periphery of the superposed part.

In the semiconductor device according to the present invention, filler is caused to remain in 50% or more of the superposed parts of the bump electrodes and pad electrodes, thereby maintaining a good electrical connection at all the electrode superposed parts.

Because if the filler is concentrated in a lump in a region smaller than 10% of the surface area of the superposed parts, there is a deterioration of electrode superposing strength and reduction of thermal joining strength in the region surrounding the region of the remaining filler, filler should be dispersed so as to cause the filler to remain in at least 10% or more of the superposed surface area between the bump electrodes and the pad electrodes.

Additionally, by making the area rate of filler in surface area of the superposed parts between the bump electrodes and the pad electrodes in which filler remains be 10% or less, it is possible to achieve good thermal adhesion to obtain a good electrical and mechanical connection.

By using particulate or fibrous filler as the filler that is dispersed in the resin used in a semiconductor device according to the present invention, it is possible to make minimum the surface area for cutting off heat and current.

In the method for manufacturing a semiconductor device according to the present invention, resin into which is dispersed a filler is first supplied over an interconnection board, and the bump electrodes of a semiconductor pellet are inserted into this resin, so that part of the filler in the resin remains at the electrode superposition boundary between the bump electrodes and the pad electrodes as a hot-pressed joint is made between the superposed parts, this method enabling the setting of the heating temperature of the semiconductor pellet to within the range 230° C. to 300° C. and the setting of the heating temperature of the interconnection board to within the range 50° C. to 120° C.

DESCRIPTION OF THE PREFERRED EMBODIMENTS

Embodiments of the present invention are described in detail below, with reference made to relevant accompanying drawings.

Figure 1:
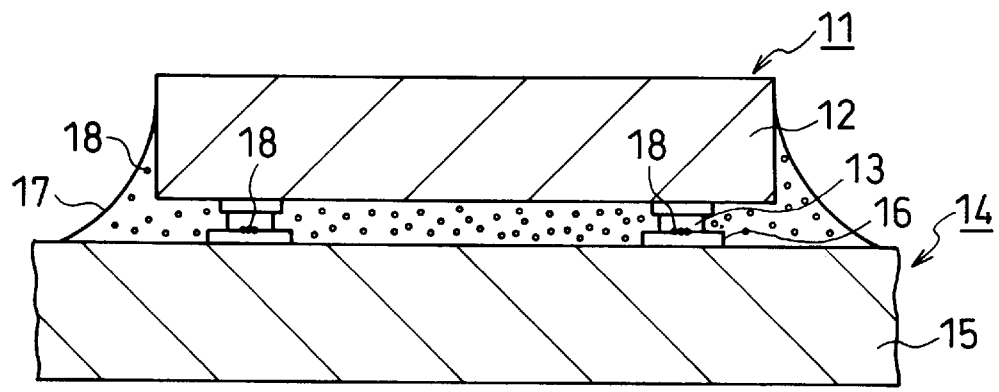
FIG. 1 is cross-section view showing a semiconductor device according to the present invention.
Figure 2:
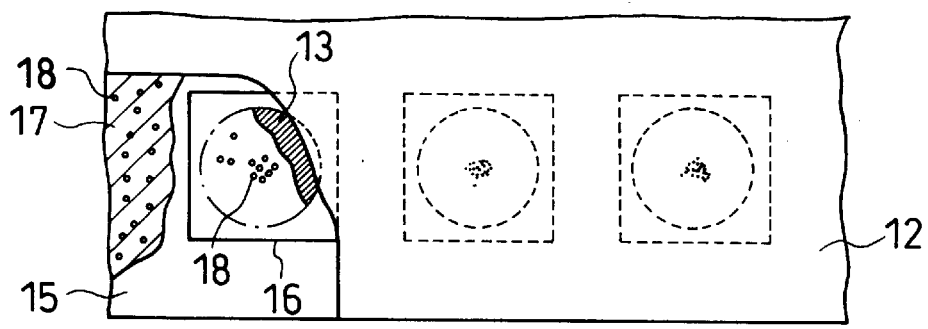
FIG. 2 is partially cutaway cross-section view of the semiconductor device of FIG. 1.

An embodiment of a semiconductor device according to the present invention is described below, with references being made to FIG. 1 and FIG. 2. In these drawings, the reference numeral 11 denotes a semiconductor pellet, on a main surface of a semiconductor substrate 12 of which are formed a large number of bump electrodes 13, the bump electrode 13 being formed by a soft conductive material like gold and the semiconductor substrate 12 having formed on it a large number of semiconductor elements (not shown in the drawing).

The reference numeral 14 denotes an interconnection board, which in this illustrated example is formed by forming a conductive pattern (not shown in the drawing) of copper foil on one side of an insulating substrate 15 made of fiberglass epoxy resin, and further over the conductive pattern of which is covered by a solder resist film (not shown in the drawing), windows being formed so as to partially expose the conductive pattern at positions opposite to the bump electrodes 13 on the solder resist film, thereby forming pad electrodes 16 at the open window positions.

The reference numeral 17 denotes a resin that makes a mechanical connection between the semiconductor pellet 11 and the interconnection board 14, and which protects the connection pattern (not shown in the drawing) of the semiconductor pellet 11 from corrosive external gases.

In a semiconductor device according to the present invention, the resin 17, into which is dispersed a filler 18 for the purpose of adjusting the coefficient of thermal expansion, is used, part of this filler 18 being caused to remain at the superposition boundary between the bump electrodes 13 and the pad electrodes 16.

Figure 3:
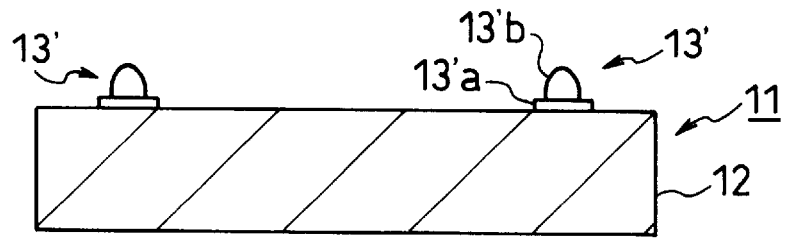
FIG. 3 is a cross-sectional view of a semiconductor pellet used in the manufacturing of the semiconductor device of FIG. 1.

An example of the above-noted semiconductor device is described below in detail, with references being made to FIG. 3 to FIG. 7. First, as shown in FIG. 3, a semiconductor pellet 11 in which bump electrodes 13' are formed on a semiconductor substrate 12, is prepared.

Figure 4:
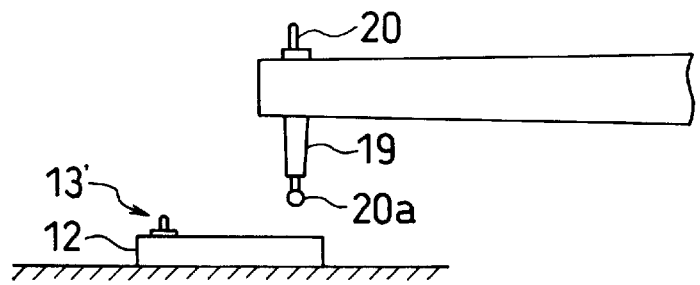
FIG. 4 is a side view showing the method of manufacturing the semiconductor pellet shown in FIG. 3.

These bump electrodes 13', as shown in FIG. 4, are formed by forming a gold ball 20a by welding, using an electrical discharge or the like, of the lower end of a gold wire 20 inserted through a capillary 19 to which ultrasonic vibration is imparted, this gold ball 20a being pressed by the lower end of the capillary 19 against a prescribed point on the semiconductor substrate 12, and pressure further applied thereto, so as to make a connection by the ultrasonic vibration, the capillary 19 and wire 20 being then both raised, and the wire 20 being cut in the vicinity of the crushed gold ball 20a. As shown in FIG. 3, the structure is one of differing diameters, with a large-diameter base part 13a' of a size of the diameter of the crushed gold ball 20a, and a small-diameter part 13b' at the point at which the wire 20 was pulled away, the end part of the small-diameter part 13b' being further constricted toward the tip thereof, so that the tip is the shape of solid parabola.

Between the large-diameter part 13a' and the small-diameter part 13b' a center part of a shape and dimension established by the internal diameter structure of the capillary 19 is formed (not shown in the drawing).

In the case of using a metal wiring having a diameter of 25 $\mu$m, the bump electrode 13' has a base part diameter of 80 to 95 $\mu$m, a base part height of 20 to 30 $\mu$m, and a height of approximately 70 $\mu$m from the base part to the tip of the small-diameter part 13b'.

Figure 5:
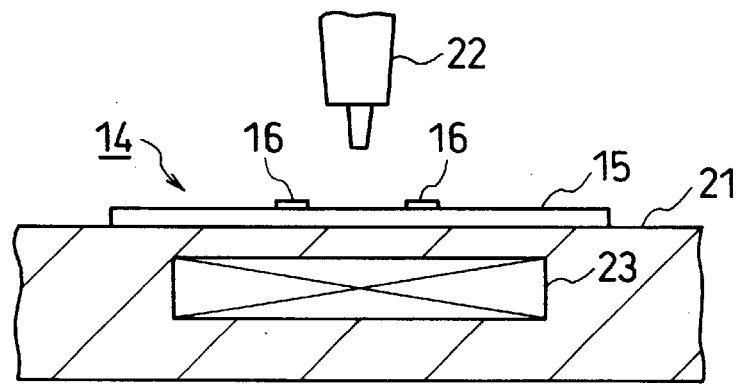
FIG. 5 is a side cross-section view of the method for manufacturing the semiconductor device of FIG. 1.

As shown in FIG. 5, an interconnection board 14 on which are formed pad electrodes 16 is positioned and placed on a prescribed part of a fiberglass epoxy resin board (insulating substrate) 15, on a supporting table 21.

The pad electrodes 16 are formed as a laminate, having a copper foil conductive pattern having a thickness of 12 to 18 $\mu$m, over which nickel is covered by plating to a thickness of 3 to 5 $\mu$m, and further over which is covered by plating gold to a thickness of 0.03 to 1 $\mu$m. In this drawing, however, the pad electrodes 16 are shown as single layers.

The reference numeral 22 denotes a resin supplying apparatus which supplies the resin 17 over the supporting table 21, moving in a horizontal direction so as to apply the fluid to a region that is surrounded by the pad electrodes 16 on the interconnection board 14.

An inorganic filler 18 is dispersed in the resin 17. This filler 18 is a fine powder having particulate or fibrous alumina or silica of a diameter from 2 to 6 $\mu$m, and is included to a level of 50 to 75% by weight in the resin 17 so as to adjust coefficient of thermal expansion thereof.

The reference numeral 23 denotes a heater that is buried in the supporting table 21, and which heats the resin 17 via the interconnection board 14.

Figure 6:
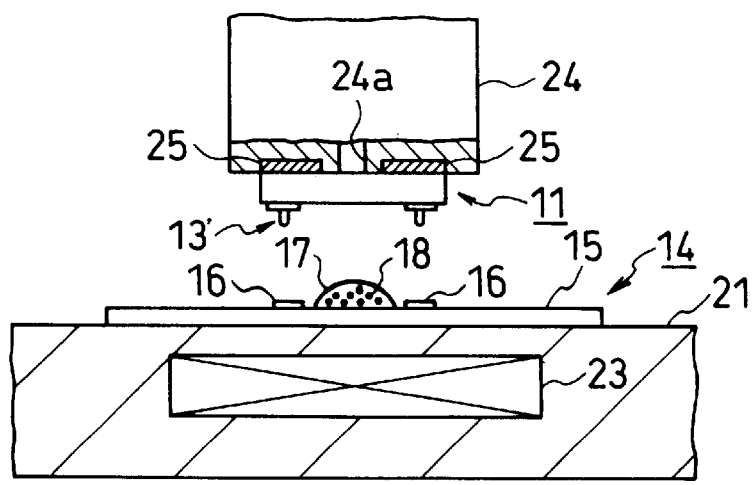
FIG. 6 is a side cross-section view of the method for manufacturing the semiconductor device of FIG. 1, which shows the condition a semiconductor pellet shown in FIG. 5 is supplied to the top of the interconnection board that is supplied with resin.

After the resin supplying apparatus 22 supplies a prescribed amount of resin 17 to the top of the interconnection board 14 that is supported and positioned by the supporting table 21, as shown in FIG. 6, a suction hole 24a at the lower end is opened, and a vacuum holding collet 24 having an internal heater 25 that is heated by a pulse current holds the semiconductor pellet 11 with the bump electrodes 13' facing downward, and moves to over the interconnection board 14.

The vacuum holding collet 24 is pressure-driven by a load cell, and when repulsive force is applied, applies a reset fixed load to the semiconductor pellet 11 which is in the process of being lowered.

Figure 7:
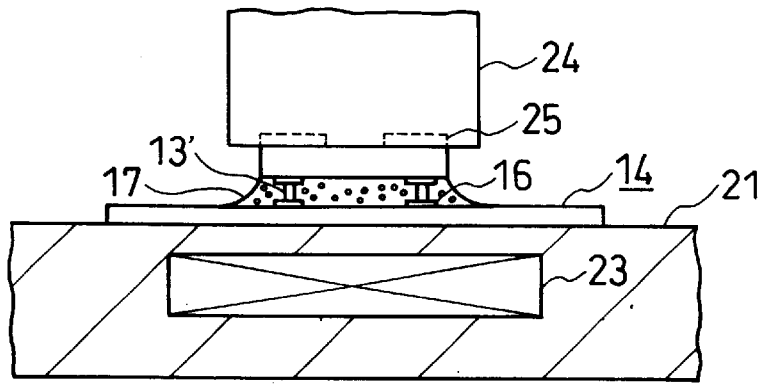
FIG. 7 is a partial enlarged side cross-section view of the method for manufacturing the semiconductor device of FIG. 1, which shows the hot-pressed connection between the bump electrodes and the pad electrodes.

Although it is not shown in the drawing, the bump electrode 13 position of the semiconductor pellet 11 that is vacuum held by the vacuum holding collet 24 is detected by image recognition and, based on this position data, the movement of the vacuum holding collet 24 is controlled so as cause the superposition of the bump electrode 13 and the pad electrode 16. When the semiconductor pellet 11 approaches the interconnection board 14, comes into contact with the resin 17 and approaches further, the resin 17 is spread outward, so that before the bump electrode 13 and pad electrode 16 make contact, the resin 17 covers the pad electrode 16, and at the point at which the bump electrode 13 and pad electrode 16 come into contact, as shown in FIG. 7, almost all of the resin 17 has been pushed to the area outside the semiconductor pellet 11.

Figure 8:
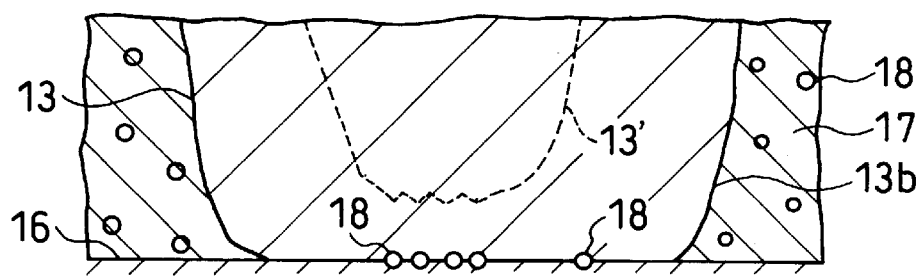
FIG. 8 is a partial enlarged side cross-section view showing the superposition between the bump electrode and the pad electrode.
Figure 9:
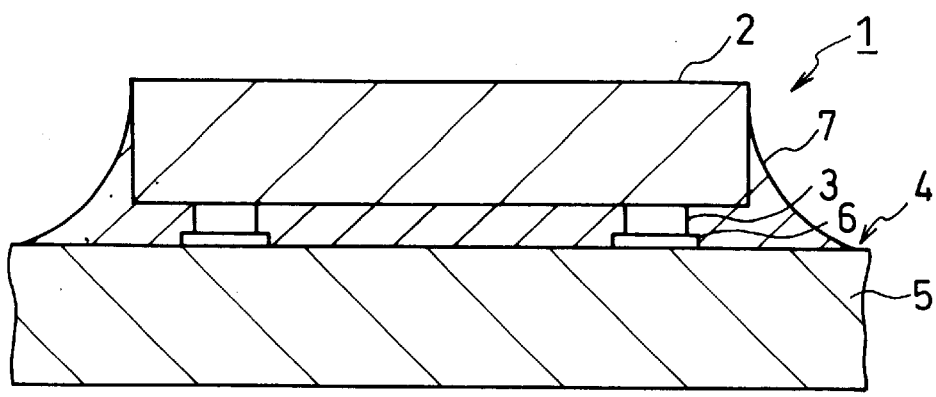
FIG. 9 is a side cross-section view showing an example of a semiconductor device according to the prior art.

Then, as shown in FIG. 8, the bump electrode 13' is lowered from the position indicated by the broken line in the drawing, and when further pressure is applied to the semiconductor pellet 11, the end part of the bump electrode 13 is pressed and crushed, so that there is an outward swelling of the periphery of the small-diameter part 13b as indicated by the solid line in the drawing.

The shape of the end part of the bump electrode 13' is formed by the pulling and breakage of the metal wire, and is substantially a solid parabolic shape, although seen in enlarged form, the end part exhibits tiny protrusions.

For this reason, when the end of the bump electrode 13 comes into contact with the pad electrode 16, the filler 18 is trapped between the electrodes.

Because the vacuum holding collet 24 pressing the semiconductor pellet 11 with a fixed amount of force, the load concentrates on a tiny surface area at the end of the bump electrode 13 which has trapped the filler 18, thereby facilitating the crushing of the end part of the bump electrode 13.

When the above occurs, the angle formed between the peripheral surface of the bump electrode 13 and the pad electrode 16 becomes successively smaller, there being outward swelling to the peripheral edge in intimate contact with the pad electrode 16, so that the filler 18 disposed at the outer periphery of the swelled part is almost entirely ejected from the superposed part.

For this reason, the electrodes 13 and 16 are superposed with filler 18 remaining at the center part of the superposition boundary between the bump electrode 13 and the pad electrode 16.

Because the load is concentrated by the end part of the bump electrode 13, the trapped filler 18 exhibits a biting in such as would be seen with a soft metal such as gold and biting into even the nickel and the copper, which are harder than gold, thereby achieving not only a mechanical connection between the two, but also preventing position offset in the direction of the superposition surface, so that even during the time when the bump electrode 13 is being crushed, the center of deformation is fixed, resulting in a uniform connection of the superposed parts of the electrodes.

This completes the process of achieving a pressure connection between the bump electrodes 13 and the pad electrodes 16, at which point, maintaining the pressure application condition of 30 gf per bump electrode of the vacuum holding collet 24, electric power is applied to the heater 23, so as to heat the interconnection board 14, and further electrical power is applied to the heater 25 of the vacuum holding collet 24, so as to heat the semiconductor pellet 11.

The heater 23 that heats the interconnection board 14 is set so that the temperature of the surface of the pad electrodes 16 reaches a temperature of 50 to 120° C., at which damage such as softening does not occur to the insulating substrate 15, and the heater 25 that heats the semiconductor pellet 11 is set so that the temperature of the bump electrodes 13 reaches 230° C. to 300° C., the heating time being set so that the resin 17 is at least half-cured, heating of the superposed parts of the electrodes 13 and 16 being applied for a prescribed amount of time, thereby achieving a hot-pressed joint.

When the electrodes 13 and 16 are hot-pressed and the resin 17 is half-cured in this manner, the electrical power is removed from the heaters 23 and 25, the semiconductor pellet 11 is released from the vacuum holding collet and raised, and the completed semiconductor device is removed from the top of the supporting table 21.

Manufacturing a semiconductor device using a semiconductor pellet 11 having 152 bump electrodes of the above-noted shape and dimensions, and a resin 17 having a filler content of 70% by weight, the resin 17 of the semiconductor device being removed by fuming nitric acid, and the semiconductor pellet 11 being peeled from the interconnection board to observe the condition of the filler 17 in the superposed boundary surface between the electrodes, it was discovered that the number of electrodes at the center part of the superposed boundary surface of which the filler 18 remained was 78, and there were 90 or more in 60% of the cases, with filler remaining at greater than 50% of the superposed locations between the bump electrodes and the pad electrodes.

Upon observing the location at which the filler remained, it was discovered that the remaining filler was almost all concentrated in the center part of the superposition between the bump electrodes and the pad electrodes, the filler remaining in a region that was at least 10% of the superposed surface area between the bump electrodes and the pad electrodes.

The above is thought to be because the pad electrodes 13 are formed as a parabolic solid shape made of a soft metal, immediately after the bump electrode 13' and pad electrode 16 come into contact, the tip of the bump electrode 13' is crushed faster than the filler 18 disposed in the vicinity of the tip of the bump electrode 13' is pushed away, so that filler 18 is trapped in a region that is greater than 10% of the superposed surface area between the electrodes.

It was discovered that the filler 18 that remains in the superposed part between the electrodes becomes sparse with increasing distance from the center part of the superposed part moving toward the periphery, and while the location at which it remains is not uniform, the portion of the superposed surface between the electrodes in which filler remains is 10% or less, and the increase in resistance between the electrodes does not affect continuity.

Upon manufacturing a comparison example of a semiconductor device using a resin that does not include a filler, the resin being removed from this example and a semiconductor device according to the present invention, it was discovered by comparing the peeling strength observed by pushing the side wall of the semiconductor pellet 11 in a direction parallel to the interconnection board, that there was no difference.

This is thought to be because the filler 18 remaining between the electrodes bites into both the end of the bump electrodes 13' and the pad electrodes 16, thereby preventing shifting of the position of the center of contact on the bump electrodes 13', this acting to remove variations in the swelling shape of each of the bump electrodes 13'.

At the initial stage of crushing a bump electrode 13', the part at which the bump electrode 13' makes contact with a pad electrode 16 is divided into tiny surface areas by the filler 18, the load being concentrated on these tiny surface areas, thereby increasing the contact pressure between the bump electrode 13' at the peripheral region of the filler 18 and the pad electrode 16, so that even although the filler 18 remains, the contact resistance is kept low.

While the above-noted embodiment of the present invention was described for the case of a semiconductor device having bump electrodes form using a metal wire having a diameter of 20 $\mu$m, by using a wire diameter that is smaller than 25 $\mu$m (for example 20 $\mu$m or 18 $\mu$m) it is possible to make the bump diameter smaller and to make the bump height smaller as well, so that even if these dimensions exhibit large non-uniformities, a good connection is achieved between the bump electrodes and the pad electrodes.

Upon performing an experiment in which the semiconductor device was stored at an extremely low temperature for a long period of time, after which the temperature was raised to start operation from a fixed low temperature and then further increased to a fixed high temperature, after which operation was stopped and the temperature lowered, followed by further cooling to an extremely low temperature, and repeating above temperature cycle, it was verified that, regardless of the size of the bump electrodes, operation was stable, without the generation of noise, and a good electrode connection was achieved.

By adopting the constitution described in detail above, filler of the resin is caused to remain at the superposed parts between the bump electrodes and the pad electrodes as the electrodes are hot-pressed together, the semiconductor pellet and the interconnection board being adhered together by the resin, thereby achieving a good, stable electrical connection between electrodes, and enabling electrodes to be made extremely small so as to accommodate a high number of electrodes.

What is claimed is:

1. A semiconductor device comprising:

a semiconductor pellet having bump electrodes;

an interconnection board having pad electrodes; and a resin in which is dispersed a filler, said filler being an insulator;

wherein said bump electrode and said pad electrode are positioned so as to be mutually opposing, with said resin into which a filler is dispersed interposing therebetween, and with said filler remaining at a superposition boundary portion formed between said electrodes, a superposition part being connected by hot pressing, so that the semiconductor pellet and the interconnection board are adhered by said resin, wherein there is filler dispersed in a region located at a part of the superposition boundary portion of the superposition part that is 10% or more of an area of the superposition boundary portion of the superposition part, and wherein, within the region, a sum of cross-sectional areas of each filler is 10% or less of an area of the region.

2. A semiconductor device according to claim 1, wherein said bump electrode is formed by a soft conductive material so that its tip part has a constricted diameter, and wherein part of said filler of said resin is caught between said tip part of said bump electrode and said pad electrode, a tip part of said pad electrode being crushed so as to cause outward swelling of a peripheral edge of the superposed part.

3. A semiconductor device according to claim 1, wherein of the number of superposed parts formed between said bump electrodes and pad electrodes, said filler is caused to remain at said superposed parts of 50% or more.

4. A semiconductor device according to claim 1, wherein said filler is caused to remain at a center part of a superposed area formed between said bump electrode and said pad electrode.

5. A semiconductor device according to claim 1, wherein said filler is either particulate or fibrous.

6. A semiconductor device according to claim 5, wherein said filler is selected from the group consisting of alumina and silica.

7. A semiconductor device comprising:

a semiconductor pellet having a plurality of bump electrodes;

an interconnection board having a plurality of pad electrodes; and a resin in which filler in which filler is dispersed, said filler being an insulator, wherein said plurality of bump electrodes and said plurality of pad electrodes are positioned to be mutually opposing, with resin therebetween at a boundary between each bump electrode and each pad electrode, each respective opposing pair of a bump electrode and a pad electrode forming a superposed part, whereby the plurality of bump electrodes and the plurality of pad electrodes form a plurality of superposed parts, wherein the semiconductor pellet and the interconnection board are adhered to each other by said resin, wherein at the boundary between the bump electrodes and the pad electrodes, the filler dispersed in the resin exists in the resin of 50% or more of the plurality of superposed parts, a remainder of superposed parts having the resin without filler, wherein, for those superposed parts having filler, filler is dispersed within, and localized to, an area that is 10% or more of an area of the boundary within a respective superposed part, wherein, within the localized area of a respective superposed part having filler, a sum of cross-sectional areas of each filler is 10% or less of the localized area.

8. A semiconductor device according to claim 7, wherein the bump electrodes are formed of a soft conductive material and comprise a tip part having a constricted diameter, wherein the localized area of a respective superposed part having filler is within a boundary between the tip part and the pad electrode.

9. A semiconductor device according to claim 8, wherein the plurality of superposed parts is formed by pressing the semiconductor pellet and the interconnection board together, crushing the tip part of each pad electrode so as to cause outward swelling of a peripheral edge of the superposed part.

10. A semiconductor device according to claim 7, wherein said filler is either particulate or fibrous.

11. A semiconductor device according to claim 10, wherein said filler is selected from the group consisting of alumina and silica.

12. A semiconductor device according to claim 7, where in the superposed parts are formed by hot pressing.

13. A semiconductor device according to claim 7, wherein for those superposed parts having filler, the filler is at a center part of the boundary between the bump electrode and the pad electrode.

* * * * *